United States Patent
Köhler et al.

(10) Patent No.: US 10,202,046 B2
(45) Date of Patent: Feb. 12, 2019

(54) CHARGING DEVICE FOR AN ENERGY STORE OF AN ELECTRIC VEHICLE

(71) Applicant: Dr. Ing. h.c. F. Porsche Aktiengesellschaft, Stuttgart (DE)

(72) Inventors: David Köhler, Bietigheim-Bissingen (DE); Volker Reber, Michelbach an der Bilz (DE)

(73) Assignee: Dr. Ing. h.c. F. Porsche Aktiengesellschaft, Stuttgart (DE)

(*) Notice: Subject to any disclaimer, the term of this patent is extended or adjusted under 35 U.S.C. 154(b) by 16 days.

(21) Appl. No.: 15/622,774

(22) Filed: Jun. 14, 2017

(65) Prior Publication Data

US 2017/0361722 A1    Dec. 21, 2017

(30) Foreign Application Priority Data

Jun. 15, 2016 (DE) .................. 10 2016 110 937

(51) Int. Cl.
*H02J 7/00* (2006.01)
*B60L 11/18* (2006.01)
*H05K 7/20* (2006.01)

(52) U.S. Cl.
CPC ....... *B60L 11/1825* (2013.01); *B60L 11/1818* (2013.01); *B60L 11/1824* (2013.01); *H02J 7/0045* (2013.01); *H05K 7/20845* (2013.01); *H05K 7/20872* (2013.01); *B60L 2230/12* (2013.01); *B60Y 2200/91* (2013.01); *Y02T 10/7005* (2013.01); *Y02T 10/7088* (2013.01); *Y02T 90/121* (2013.01); *Y02T 90/14* (2013.01)

(58) Field of Classification Search
CPC .. B60L 11/1818; B60L 11/1825; H02J 7/0045
USPC ........................................ 320/104, 107, 109
See application file for complete search history.

(56) References Cited

U.S. PATENT DOCUMENTS

| | | | | |
|---|---|---|---|---|
| 2013/0267115 A1* | 10/2013 | Mark | ............. | H01R 13/005 439/485 |
| 2016/0221458 A1* | 8/2016 | Lopez | ............. | B60L 11/1816 |

FOREIGN PATENT DOCUMENTS

| | | |
|---|---|---|
| DE | 102011109414 A1 | 2/2012 |
| DE | 102010050562 B3 | 4/2012 |
| DE | 202013105353 U1 | 12/2013 |
| DE | 102015101140 A1 | 7/2016 |
| DE | 102016101115 A1 | 8/2016 |

OTHER PUBLICATIONS

German Search Report, with partial English translation, for German Application No. 10 2016 110 937.1, dated May 22, 2017—8 Pages.

* cited by examiner

*Primary Examiner* — Edward Tso
*Assistant Examiner* — Aaron Piggush
(74) *Attorney, Agent, or Firm* — RatnerPrestia

(57) ABSTRACT

A charging device for an energy store of an electrically driven vehicle, which includes a charging plug for transmitting an electrical charge to the energy store of the motor vehicle, a charging line for connecting the charging plug to a power grid, and a charging pillar with a docking station for receiving the charging plug when it is not in use and for connecting the charging line to the power grid. A cooling device for cooling the charging plug is arranged in the docking station.

11 Claims, 2 Drawing Sheets

CHARGING DEVICE FOR AN ENERGY STORE OF AN ELECTRIC VEHICLE

CROSS-REFERENCE TO RELATED APPLICATIONS

Figure 1:
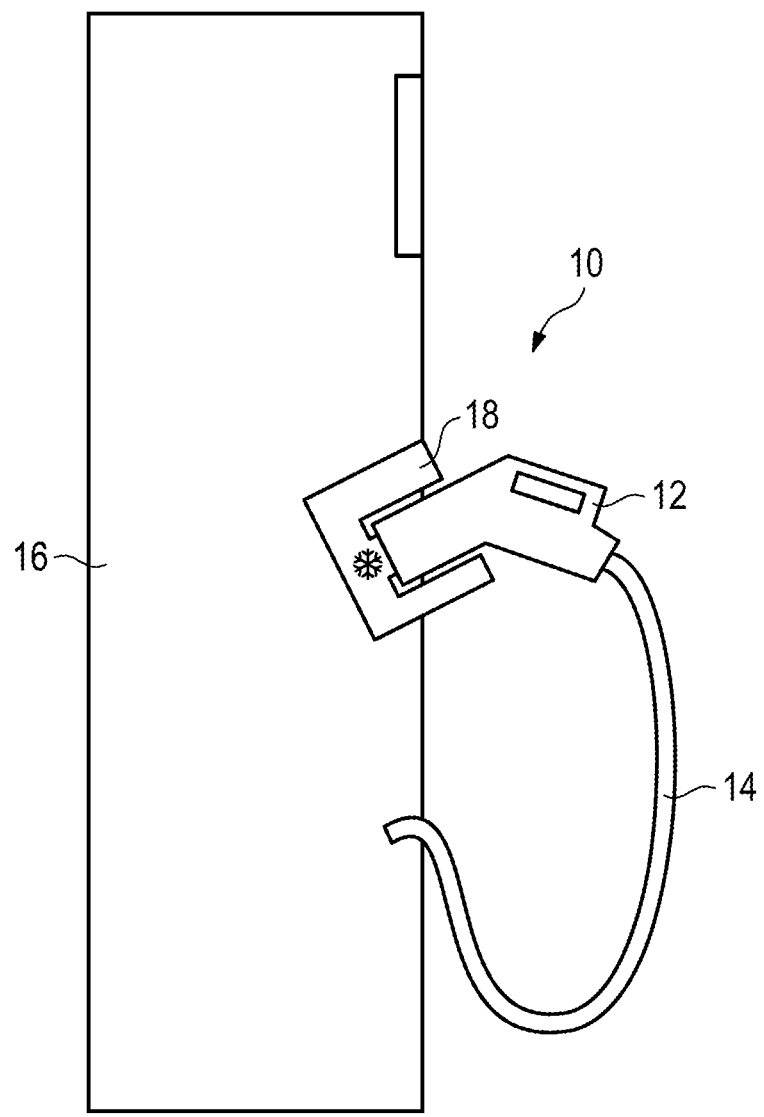

This application claims priority to German Patent Application No. DE 10 2016 110 937.1, filed Jun. 15, 2016, the contents of such application being incorporated by reference herein in its entirety.

FIELD OF THE INVENTION

The invention relates to a charging device for an energy store of an electrically driven vehicle and to a method for charging the energy store with the charging device.

BACKGROUND OF THE INVENTION

The limiting criterion when charging, in particular quick charging, an energy store of an electrically driven vehicle is the contact temperature the charging plug of the charging device and the vehicle connection. As a result of the drop in voltage of the plug connection the plug connection between the charging plug and the vehicle connection heats by a corresponding temperature delta. In order to achieve high performance levels when charging electric vehicles, a cooling means is integrated into the charging plug and the cooling lines are led through the charging cable. For example, DE 10 2010 050 562 B3, which is incorporated by reference herein, describes a device for charging an electric vehicle in which a plug which can be connected to the vehicle to be charged is connected to a cooling circuit in order to cool at least part of the plug.

There is therefore constant need to simplify the design of the plug and the charging line of a charging device for an energy store of an electrically driven vehicle.

SUMMARY OF THE INVENTION

Described herein are measures which simplify a charging device for an energy store of an electrically driven vehicle.

The invention relates to a charging device for an energy store of an electrically driven vehicle, comprising a charging plug for transmitting an electrical charge to the energy store of the motor vehicle, a charging line for connecting the charging plug to a power grid, and a charging pillar with a docking station for receiving the charging plug when it is not in use and for connecting the charging line to the power grid, wherein a cooling device for cooling the charging plug is arranged in the docking station.

In this context, the charging device can be a charging station for an electrically driven vehicle. The energy store can be a battery, in particular a traction battery. By means of an arrangement of the cooling device in the charging column, the charging plug can be cooled to a predefined temperature or kept at a predefined temperature in the docking station during a resting phase before a vehicle is charged. In this way, the charging plug can be pre-conditioned to a predefined desired low temperature, for example less than or equal to 10° C. In this way, a pre-cooled charging plug can be used to charge a motor vehicle. After the termination of the charging process, the plug can be plugged into the docking station again in order to be cooled. In this context, the cooling device can be configured and/or selected in such a way that corresponds to the frequency of use of the charging device. The time period between a vehicle driving away and the following vehicle approaching can be used to cool the charging plug and should be sufficient to cool the charging plug to a predefined desired temperature. If, for example in the case of high ambient temperatures, the charging process is aborted owing to overheating of the charging plug, the charging plug can be briefly cooled in the docking station.

Furthermore, such a design permits a more lightweight charging line owing to a lack of cooling hoses in the charging line. In particular, the complexity of the design of the charging plug can be reduced, since the cooling device is integrated into the charging pillar. The docking station can be freely configured owing to the relatively large installation space in the charging pillar.

In this way, a charging device for an energy store of an electrically driven vehicle can be configured in a simplified way.

It is preferred that the cooling device has an air cooling device. A surface of heat-generating objects can be cooled with the aid of a cooling device by means of air which flows past said surface. The movement of air which is necessary for air cooling can be provided either by convection or by means of a fan. In this case, the charging plug can also have cooling fins and/or a heat sink as a heat exchanger, in order to permit greater outputting of heat by virtue of a larger surface.

The cooling device preferably has a liquid cooling device. By means of a liquid cooling device, a heat-generating apparatus can be cooled using a liquid. This has the advantage over air cooling that relatively large quantities of heat can be carried away. For example, water or oil can be used as the cooling fluid. For example, a liquid device can be configured in such a way that a cooling fluid flows around the docking station. The inner wall of a receptacle of the docking station makes contact with the charging plug and in this way can transmit heat from the charging plug to the cooling fluid.

In one preferred embodiment, the cooling device has an electrical cooling device, in particular a Peltier element. An electrical cooling device is an electrothermal converter which can generate a temperature difference on the basis of the Peltier effect when current flows through.

The invention also relates to a method for cooling a charging plug having a charging device which is embodied or can be developed as above, comprising the steps: plugging the charging plug into the docking station, and cooling the charging plug to a predefined temperature in the docking station.

By means of these methods a charging plug can easily be cooled. In particular, such a method can permit simplification of a charging device, since instead of being integrated in a costly fashion into a charging plug and into a charging line the cooling device can easily be integrated into the charging pillar. By means of the method, the charging plug can be pre-conditioned to a predefined desired temperature before the charging in the docking station.

In this way, a charging device for an energy store of an electrically driven vehicle can be simplified by means of the method.

It is preferred that the charging plug is cooled to a predefined temperature and kept at the predefined temperature by the docking station between a vehicle driving away and subsequent vehicle approaching. In this way, the charging plug can be used immediately for charging a subsequent vehicle. A waiting time for the cooling of the charging plug can therefore be avoided.

When a charging process is aborted because of overheating of the charging plug, the charging plug is preferably plugged into the docking station for the purpose of cooling. In this way, the charging plug can be rapidly cooled to a predefined temperature by the docking station. In particular, by virtue of the method the charging device can even be used in environments which have a high ambient temperature.

In one preferred embodiment, the predefined temperature is lower than or equal to 10° C. Such a predefined temperature makes it possible that the charging plug does not overheat during the charging process and the resulting contact temperature, with the result that fault-free and interruption-free charging of the vehicle can be made possible.

It is preferred that the docking station determines the temperature of the charging plug before the cooling. In this way, the cooling device can be set in accordance with the temperature of the charging plug, with the result that the cooling device requires more or less energy for cooling depending on the requirements. In particular, the docking station can determine the temperature of the charging plug during the charging process, with the result that the cooling device can already be correspondingly set when the charging plug is plugged into the docking station, in order to cool the charging plug to a predefined temperature.

The charging plug is preferably used for a rapid charging process. As a result of the rapid charging, an energy store of a vehicle can be charged within a very short time, with the result that long waiting times for the vehicle user can be avoided.

BRIEF DESCRIPTION OF THE DRAWING FIGURES

The invention will be explained by way of example below with reference to the appended drawings and using preferred exemplary embodiments, wherein the features which are presented below can form one aspect of the invention either individually or in combination. In the drawings:

FIG. 1: shows a schematic drawing of a charging device, and

Figure 2:
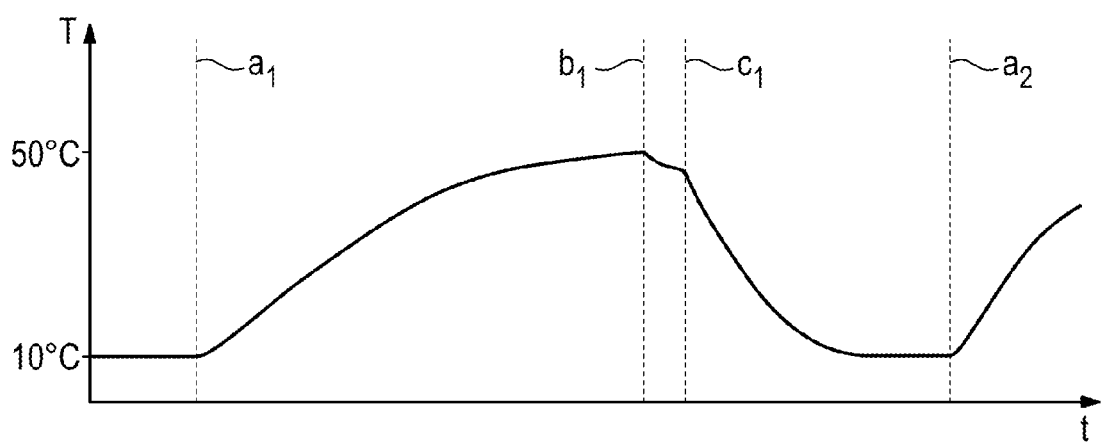

FIG. 2: shows a curve profile of the temperature of the charging plug during the charging of an energy store and during the cooling in the docking station.

DETAILED DESCRIPTION OF THE INVENTION

FIG. 1 illustrates a charging device 10 for charging an energy store, for example a traction battery, of a motor vehicle (not illustrated). In this context, the charging device 10 is used, in particular, for quick charging of the energy store. The charging device 10 comprises a charging plug 12 for transmitting an electrical charge to the energy store of the motor vehicle, a charging line 14 for connecting the charging plug 12 to a power grid, and a charging pillar 16 with a docking station 18 for receiving the charging plug 12 when it is not in use, and for connecting the charging line 14 to the power grid. It is apparent in FIG. 1 that the charging plug 12 is received in the docking station 18. The charging line 14 is connected to the power grid within the charging pillar. The docking station 18 comprises a cooling device for cooling the charging plug 12. The cooling device is represent symbolically by a star in the docking station 18. The cooling means may be, for example, an air cooling device in the form of a fan, a liquid cooling device and/or a Peltier element. In this context, the docking station 18 can determine the temperature of the charging plug 12 and cool the charging plug 12 to a predefined temperature of, for example, 10° C. or keep it at the predefined temperature of, for example 10° C., depending on requirements.

FIG. 2 illustrates a temperature profile of the charging plug 12 of the charging device 10 in FIG. 1. The time t is plotted on the x axis, and the temperature T on the y axis. The charging plug 12 is kept at a temperature of 10° C. by the docking station 18 up to the time a1. At the time a1, the charging plug 12 is connected to a vehicle in order to charge an energy store of the vehicle, for example a traction battery, in a quick charging method. In this context, the temperature in the charging plug 12 rises over time t to 50°, up to the time b1. At the time b1, the charging process at the vehicle is ended or the charging plug 12 is overheated, with the result that the charging process has to be aborted. At the time c1, the charging plug 12 is plugged into the charging station 18. Between the time b1 and the time c1, the charging plug 12 is already cooled by the ambient air when the charging plug 12 is decoupled from the vehicle up to the plugging into the docking 18. At the time c1, the docking station 18 determines the temperature of the charging plug 12, and the cooling device of the docking station 18 is operated in accordance with the temperature of the charging plug 12, in order to cool the charging plug to 10° C. as quickly as possible. The charged vehicle drives away between the time c1 and the time a2, and a subsequent vehicle approaches. In this time period, the charging plug 12 is cooled to 10° C. The vehicle which has approached is charged from the time a2.

What is claimed is:

1. A charging device for an energy store of an electrically driven vehicle, comprising:
   a charging plug configured for transmitting an electrical charge to the energy store of the electrically driven vehicle,
   a charging line configured for connecting the charging plug to a power grid,
   a charging pillar with a docking station configured for receiving the charging plug when the charging plug is not in use and for connecting the charging line to the power grid, and
   a cooling device arranged in the docking station and configured for cooling the charging plug when the charging plug is docked in the docking station and positioned in physical contact with the cooling device, wherein the cooling device is separated from the charging plug when the charging plug is connected to the electrically driven vehicle.

2. The charging device as claimed in claim 1, wherein the cooling device has an air cooling device.

3. The charging device as claimed in claim 1, wherein the cooling device has a liquid cooling device.

4. The charging device as in claim 1, wherein the cooling device has an electrical cooling device.

5. The charging device as claimed in claim 4, wherein the electrical cooling device is a Peltier element.

6. A method for cooling the charging plug having the charging device as claimed in claim 1, comprising the steps:
   plugging the charging plug into the docking station, and
   cooling the charging plug to a predefined temperature in the docking station.

7. The method as claimed in claim 6, wherein the charging plug is cooled to the predefined temperature and kept at the predefined temperature by the docking station between a vehicle driving away and a subsequent vehicle approaching.

8. The method as claimed in claim 6, wherein in the event of a charging process being aborted because of overheating of the charging plug, the charging plug is plugged into the docking station for the purpose of cooling.

9. The method as claimed in claim 6, wherein the predefined temperature is lower than or equal to 10° C.

10. The method as claimed in claim 6, wherein the docking station determines the temperature of the charging plug before the cooling.

11. The method as claimed in claim 6, wherein the charging plug is used for a quick charging process of the energy store of the electrically driven vehicle.

* * * * *